(12) United States Patent
Kagami

(10) Patent No.: US 12,119,832 B2
(45) Date of Patent: Oct. 15, 2024

(54) ATOMIC OSCILLATOR

(71) Applicant: NEC Corporation, Tokyo (JP)

(72) Inventor: Sota Kagami, Tokyo (JP)

(73) Assignee: NEC CORPORATION, Tokyo (JP)

( * ) Notice: Subject to any disclaimer, the term of this patent is extended or adjusted under 35 U.S.C. 154(b) by 92 days.

(21) Appl. No.: 18/101,737

(22) Filed: Jan. 26, 2023

(65) Prior Publication Data

US 2023/0318610 A1  Oct. 5, 2023

(30) Foreign Application Priority Data

Mar. 30, 2022 (JP) ................................. 2022-056941

(51) Int. Cl.
*H03L 7/26* (2006.01)
(52) U.S. Cl.
CPC ...................................... *H03L 7/26* (2013.01)
(58) Field of Classification Search
CPC ........................................................ H03L 7/26
USPC ......................................................... 331/94.1
See application file for complete search history.

(56) References Cited

U.S. PATENT DOCUMENTS

| | | | |
|---|---|---|---|
| 2012/0229222 A1* | 9/2012 | Balet | G04F 5/14 331/1 R |
| 2012/0256696 A1* | 10/2012 | Lecomte | G04F 5/145 331/94.1 |
| 2019/0386668 A1* | 12/2019 | Tanaka | H03L 7/26 |

FOREIGN PATENT DOCUMENTS

JP  2007-036556 A  2/2007

* cited by examiner

*Primary Examiner* — Joseph Chang
(74) *Attorney, Agent, or Firm* — Sughrue Mion, PLLC

(57) ABSTRACT

An atomic oscillator according to the present invention includes an alkali metal cell, a light source configured to emit excitation light to the alkali metal cell, and a photodetector configured to detect transmission light passed through the alkali metal cell. In the atomic oscillator, a light absorber and a light radiator are placed. The light absorber is configured to raise a temperature thereof in accordance with absorption light to heat the alkali metal cell in contact with the alkali metal cell. The light radiator is configured to radiate light corresponding to heat of the alkali metal cell in contact therewith. The atomic oscillator further includes a second light source configured to emit light to the light absorber, and a second photodetector configured to detect the light radiated by the light radiator.

10 Claims, 7 Drawing Sheets

ATOMIC OSCILLATOR

INCORPORATION BY REFERENCE

This application is based upon and claims the benefit of priority from Japanese patent application No. 2022-056941, filed on Mar. 30, 2022, the disclosure of which is incorporated herein in its entirety by reference.

TECHNICAL FIELD

The present invention relates to an atomic oscillator and a method for control thereof.

BACKGROUND ART

The performance of atomic oscillators and atomic clocks is generally evaluated based on the frequency accuracy thereof. In a CPT (Coherent Population Trapping) type atomic clock that operates by causing the difference frequency of lasers to resonate with an atomic level with a long relaxation life called the clock transition of an alkali metal atom and locking the frequency to the signal, the signal/noise ratio of the signal is involved in the frequency accuracy, and therefore, it is required to increase the signal intensity involved in the atomic resonance in order to increase the performance.

The abovementioned signal intensity is proportional to the square root of the number of atoms within the speed of light of incident light resonating with the quantum level. Therefore, in an atomic oscillator, it is just necessary to increase the number of atoms involved by heating a glass cell containing Cs or Rb with a heater to raise the vapor pressure. However, with this method, magnetic field fluctuations are generated by electric current used to heat the heater, and the magnetic field fluctuations cause Zeeman shift, which is one of the noise factors, so that there is a problem of difficulty in increasing the frequency accuracy.

On the other hand, as described in Patent Document 1, another method of heating a cell without using a heater is also disclosed. In Patent Document 1, in a cell whose outside is covered with a heat insulating material, a window is formed by removing the heat insulating material, a light heating unit that irradiates the window with light is placed, and the cell is heated by the irradiation of the light. Moreover, a cell temperature sensor that measures the temperature of the cell without contact is also provided corresponding to another window formed in the cell.

Patent Document 1: Japanese Unexamined Patent Application Publication No. JP-A 2007-036556

However, in the technique disclosed in Patent Document 1 described above, there is a need to form a plurality of windows obtained by removing a heat insulating material around the outer circumference of a cell covered with the heat insulating material. As a result, the configuration becomes complicated, which causes problems such as complication of the manufacturing process and increase of the cost.

SUMMARY OF THE INVENTION

Accordingly, an object of the present invention is to solve the abovementioned problems, that is, problems of complicating the manufacturing process and increasing the cost in a configuration in which an alkali metal cell is heated in order to increase the frequency accuracy of an atomic oscillator.

An atomic oscillator as an aspect of the present invention includes: an alkali metal cell; a light source configured to emit excitation light to the alkali metal cell; and a photodetector configured to detect transmission light passed through the alkali metal cell. In the atomic oscillator, a light absorber and a light radiator are placed. The light absorber is configured to raise a temperature thereof in accordance with absorption light to heat the alkali metal cell in contact with the alkali metal cell. The light radiator is configured to radiate light corresponding to heat of the alkali metal cell in contact therewith. The atomic oscillator further includes: a second light source configured to emit light to the light absorber; and a second photodetector configured to detect the light radiated by the light radiator.

Further, a method for controlling an atomic oscillator as an aspect of the present invention is a method for controlling an atomic oscillator that includes an alkali metal cell, a light source configured to emit excitation light to the alkali metal cell, and a photodetector configured to detect transmission light passed through the alkali metal cell. The method includes: emitting light to a light absorber placed in contact with the alkali metal cell and configured to raise a temperature thereof in accordance with absorption light to heat the alkali metal cell, from a second light source that is different from the light source; and detecting light radiated from a light radiator placed in contact with the alkali metal cell and configured to radiate light corresponding to heat of the alkali metal cell in contact therewith, by a second photodetector that is different from the photodetector.

Further, a control apparatus as an aspect of the present invention is a control apparatus controlling an operation of an atomic oscillator that includes an alkali metal cell, a light source configured to emit excitation light to the alkali metal cell, and a photodetector configured to detect transmission light passed through the alkali metal cell. The control apparatus is configured to: emit light to a light absorber placed in contact with the alkali metal cell and configured to raise a temperature thereof in accordance with absorption light to heat the alkali metal cell, from a second light source that is different from the light source; and detect light radiated from a light radiator placed in contact with the alkali metal cell and configured to radiate light corresponding to heat of the alkali metal cell in contact therewith, by a second photodetector that is different from the photodetector.

Further, a computer program as an aspect of the present invention includes instructions for causing a control apparatus, which controls an operation of an atomic oscillator including an alkali metal cell, a light source configured to emit excitation light to the alkali metal cell, and a photodetector configured to detect transmission light passed through the alkali metal cell, to execute processes to: emit light to a light absorber placed in contact with the alkali metal cell and configured to raise a temperature thereof in accordance with absorption light to heat the alkali metal cell, from a second light source that is different from the light source; and detect light radiated from a light radiator placed in contact with the alkali metal cell and configured to radiate light corresponding to heat of the alkali metal cell in contact therewith, by a second photodetector that is different from the photodetector.

With the configurations as described above, the present invention enables easy manufacture at low cost and increase of the frequency accuracy of an atomic oscillator.

EXAMPLE EMBODIMENT

First Example Embodiment

Figure 1:
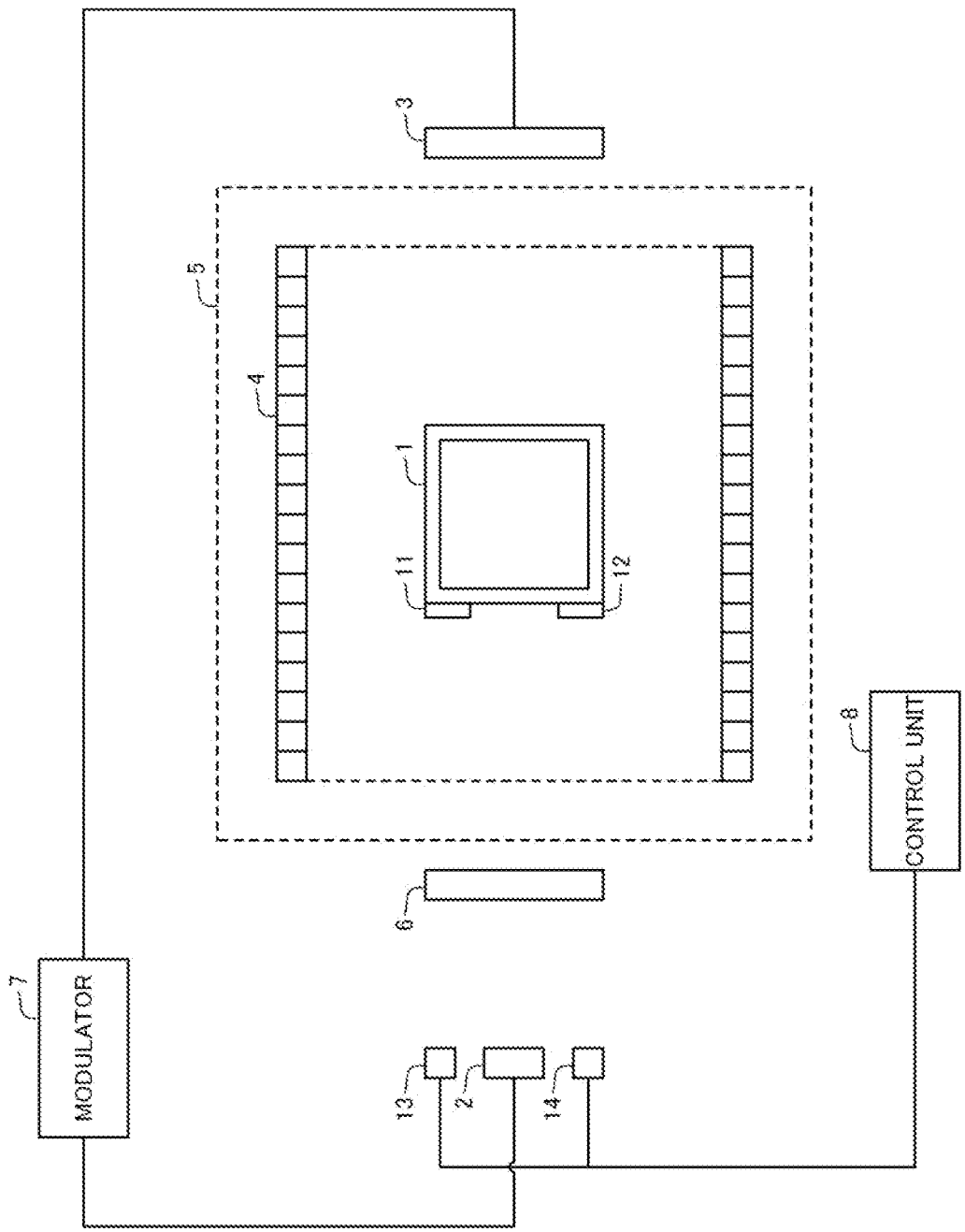
FIG. 1 is a block diagram showing a configuration of an atomic oscillator in a first example embodiment of the present invention.
Figure 2:
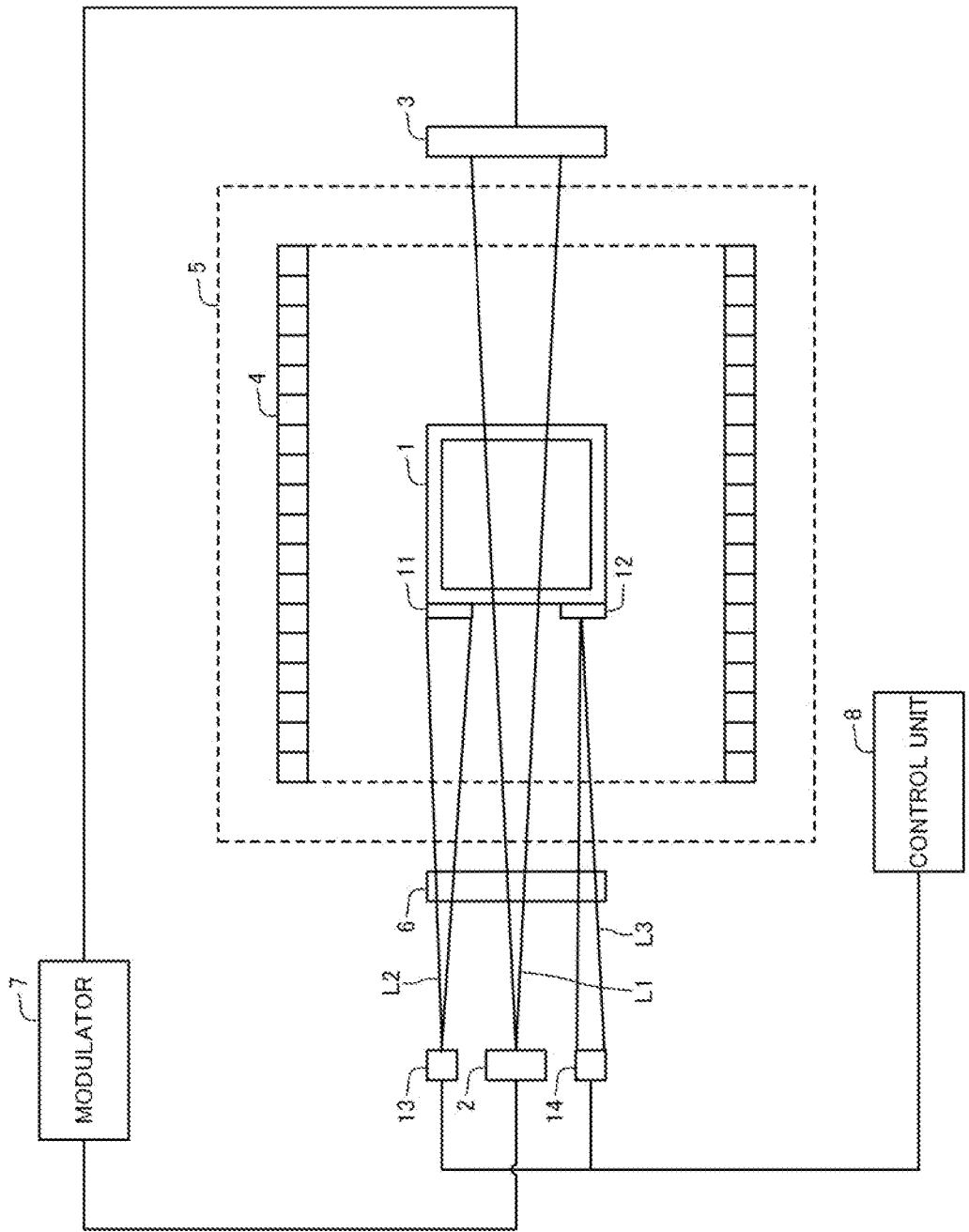
FIG. 2 is a figure showing how the atomic oscillator disclosed in FIG. 1 works.
Figure 3:
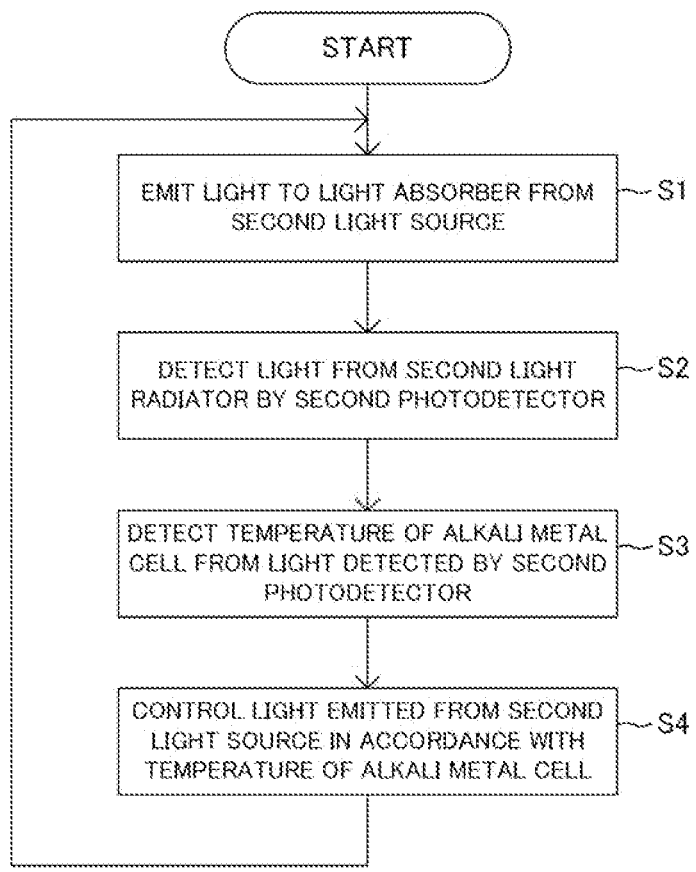
FIG. 3 is a flowchart showing a control operation of the atomic oscillator disclosed in FIG. 1.

A first example embodiment of the present invention will be described with reference to FIGS. 1 to 3. FIGS. 1 to 2 are figures for describing a configuration of an atomic oscillator, and FIG. 3 is a figure for describing a control operation of the atomic oscillator.

[Configuration]

FIG. 1 is a block diagram showing a configuration of an atomic oscillator according to this example embodiment. The atomic oscillator in this example embodiment includes an alkali metal cell 1, a light source 2 that irradiates the alkali metal cell 1 with excitation light, and a photodetector 3 that detects transmitted light having passed through the alkali metal cell 1.

The alkali metal cell 1 contains alkali metal atoms such as cesium atoms, rubidium atoms, sodium atoms and potassium atoms. The alkali metal cell 1 is placed in a space to which a magnetic field is applied by a coil 4. As shown in FIG. 2, excitation light L1 from the light source 2 is made incident and part of the light is transmitted. Furthermore, the coil 4 in which the alkali metal cell 1 is installed in the internal space is covered with a magnetic shield 5.

The light source 2 generates excitation light having a single wavelength and also generates two excitation lights L1 by performing phase modulation from the excitation light having the single wavelength and, as shown in FIG. 2, irradiates the alkali metal cell 1 with the lights through a waveplate 6. The excitation lights L1 from the light source 2 are emitted with a modulation frequency of a modulator 7 being swept.

As shown in FIG. 2, the photodetector 3 detects transmitted light having passed through the alkali metal cell 1, and measures the amount of the transmitted light. The atomic oscillator has a function of controlling an oscillation frequency by an optical absorption characteristic due to a quantum interference effect of two kinds of resonant lights based on the measured amount of the transmitted light.

The atomic oscillator in this example embodiment includes, in addition to the above components, a light absorber 11 and a light radiator 12 that are placed in contact with the outer surface of the alkali metal cell 1 as shown in FIG. 1. Along with this, the atomic oscillator also includes a second light source 13 that irradiates the light absorber 11 with light and a second photodetector 14 that detects the light radiated from the light radiator 12.

The light absorber 11 is formed of, for example, non-magnetic black body paint, and is placed by being applied to the outer surface of the alkali metal cell 1. The light absorber 11 absorbs irradiation light, generates heat with the absorption light, and heats the alkali metal cell in close contact by heat conduction and heat radiation. In particular, the light absorber 11 is formed of a member that has a higher absorptivity to the wavelength of the light emitted from the second light source 13 than to the wavelength of the light emitted from the light source 2. That is to say, the light absorber 11 is formed of a member that absorbs the light emitted from the second light source 13 more than the light emitted from the light source 2. The light absorber 11 is not necessarily formed by applying black body paint to the outer surface of the alkali metal cell 1, and may be formed of a film member and attached to the outer surface of the alkali metal cell 1. Furthermore, the light absorber 11 may be formed of a member having any shape and any color as long as it is placed in contact with the outer surface of the alkali metal cell 1 and generates heat with absorption light.

The light absorber 11 described above is not necessarily limited to being placed on the outer surface of the alkali metal cell 1, and may be placed in contact with any part of the faces forming the alkali metal cell 1. For example, in a case where the wall surface of a housing (case) forming the outer shape of the alkali metal cell 1 is formed of a member that transmits light, the light absorber 11 may be placed on the inner surface of the alkali metal cell 1.

In the above description, the light absorber 11 is a member that absorbs light and generates heat, but may be any member as long as it receives light and raises its temperature. For example, the light absorber 11 may be a member that raises its temperature or generates heat when a chemical reaction is induced by being irradiated with light.

The second light source 13 is configured to irradiate the light absorber 11 with light having a wavelength with high absorption efficiency in the light absorber 11, and is configured by, for example, an infrared laser. With this, as shown in FIG. 2, the light absorber 11 raises its temperature by absorbing light L2 emitted by the second light source 13, and can heat the alkali metal cell 1 in close contact therewith. As an example, the second light source 13 can efficiently heat the alkali metal cell 1 by emitting light having a wavelength of 1.5 μm, which has high directivity and high efficiency in converting electric current into light. Such a wavelength of light is shorter than the wavelength of light that can be detected by the second photodetector 14, which will be described later. Furthermore, the second light source 13 is configured to emit light having a wavelength at which the photodetector 3 has no quantum efficiency.

The light radiator 12 is formed of, for example, non-magnetic black body paint, and is placed by being applied to the outer surface of the alkali metal cell 1 as well as the light absorber 11 described above. Then, as shown in FIG. 2, the light radiator 12 emits light L3 corresponding to the heat of the alkali metal cell 1 in close contact by black body radiation. At the time, it is desirable to make the size of the light radiator 12, that is, the surface area of the light radiator 12 smaller so that the heat of the alkali metal cell 1 is not emitted too much. On the other hand, since the light absorber 11 described above receives more light, and heats the alkali metal cell 1 by heat conduction and heat radiation to increase the temperature, it is desirable to form it larger so that the alkali metal cell 1 is heated more efficiently. Therefore, it is preferable to, comparing the sizes of the light absorber 11 and the light radiator 12, form the light absorber 11 larger and the light radiator 12 smaller. However, the size of the light absorber 11 does not necessarily need to be larger than that of the light radiator 12, and it is desirable to form the light absorber 11 larger than a spot diameter (mode field) formed on the surface of the alkali metal cell 1 by the light L2 emitted from the second light source 13.

The light radiator 12 is not necessarily limited to being formed by applying black body paint to the outer surface of the alkali metal cell 1, and may be formed of a film member and attached to the outer surface of the alkali metal cell 1. Furthermore, the light radiator 12 may be formed of a member having any shape and any color as long as it is placed in contact with the outer surface of the alkali metal cell 1 and radiates light corresponding to the heat of the alkali metal cell 1. For example, the light radiator 12 is desirably a member having a high light absorptivity to the fluorescence of atoms inside the alkali metal cell 1 and the wavelength from the light source 2.

The light radiator 12 is not necessarily limited to being placed on the outer surface of the alkali metal cell 1, and may be placed in contact with any part of the faces forming the alkali metal cell 1. For example, in a case where the wall surface of a housing (case) that forms the outer shape of the alkali metal cell 1 is formed of a member that transmits light, the light radiator 12 may be placed on the inner surface of the alkali metal cell 1.

As shown in FIG. 2, the second photodetector 14 is placed facing the light radiator 12 described above, and detects light L3 radiated from the light radiator 12. The second photodetector 14 is, for example, a radiation thermometer such as a bolometer. With this, the second photodetector 14 receives black body radiation from the light radiator 12, and can thereby detect the temperature of the alkali metal cell 1. In particular, the second photodetector 14 is desirably capable of detecting light having a wavelength that enables more efficient detection of a predetermined radiation temperature from room temperature to around 100° C. For example, the second photodetector 14 is desirably configured to be able to detect light having a long wavelength, such as light having a wavelength of 10 µm. Consequently, the wavelength of light emitted from the second light source 13 described above is shorter than the wavelength of light that can be detected by the second photodetector 14, and the photodetector 14 is thereby configured not to detect the light from the second light source 13. The photodetector 14 may include a filter (for example, a wavelength long-pass filter) or the like that has a characteristic of transmitting only wavelengths longer than the wavelengths of the light L2 and the light L1. The photodetector 14 may also include a mechanism such as a lens that selectively detects the light L3 from the light radiator 12.

A control unit 8 is configured by a control apparatus including an arithmetic logic unit and a memory unit. Then, the control unit 8 constructs a function of controlling the operation of the atomic oscillator as will be described below by execution of a program by the arithmetic logic unit. Specifically, the control unit 8 controls the second light source 13 to emit light, and also controls the second photodetector 14 to detect the light. Then, the control unit 8 further detects the temperature of the alkali metal cell 1 based on the light detected by the second photodetector 14 and controls light emitted from the second light source 13 based on the detected temperature. For example, the control unit 8 determines whether the temperature of the alkali metal cell 1 detected based on the light from the second photodetector 14 is higher or lower than a preset temperature. When the temperature is lower, the control unit 8 performs control to increase the intensity of the light emitted from the second light source 13 to raise the temperature of the alkali metal cell 1 and, when the temperature is higher, the control unit 8 performs control to decrease the intensity of the light emitted from the second light source 13 or stop emission of the light to lower the temperature of the alkali metal cell 1.

[Operation]

Next, an operation of the atomic oscillator will be described mainly with reference to a flowchart of FIG. 3. In particular, an operation of the control unit 8 to detect and control the temperature of the alkali metal cell 1 of the atomic oscillator will be described below. For this, in the atomic oscillator, as indicated by reference symbol L1 in FIG. 2, light L1 is emitted from the light source 2 to the alkali metal cell 1, light that has passed through the alkali metal cell 1 is detected by the photodetector 3, and the oscillation frequency is controlled by an optical absorption characteristic due to a quantum interference effect of two types of resonant light.

The control unit 8 performs control to emit light L2 from the second light source 13 as indicated by reference symbol L2 in FIG. 2 (step S1). Consequently, the light absorber 11 absorbs the light L2 emitted by the second light source 13 and thereby raises its temperature, and the alkali metal cell 1 in close contact therewith is heated. Moreover, the control unit 8 performs control to detect light L3 radiated from the light radiator 12 as indicated by reference symbol L3 in FIG. 2 (step S2). Consequently, the control unit 8 detects the temperature of the alkali metal cell 1 from light detected by the second photodetector 14 from the light radiator 12 (step S3).

Then, the control unit 8 controls the light emitted from the second light source 13 in accordance with the detected temperature of the alkali metal cell 1 (step S4). Thus, the control unit 8 performs control to keep the temperature of the alkali metal cell 1 within a desired temperature range.

As described above, in this example embodiment, with a simple configuration such that the alkali metal cell 1 is provided with the light absorber 11 and the light radiator 12, such as black body paint, and the second light source 13 and the second photodetector 14, the temperature of the alkali metal cell 1 can be kept appropriately. As a result, it is possible to easily manufacture an atomic oscillator that can increase the frequency accuracy at low cost.

Second Example Embodiment

Figure 4:
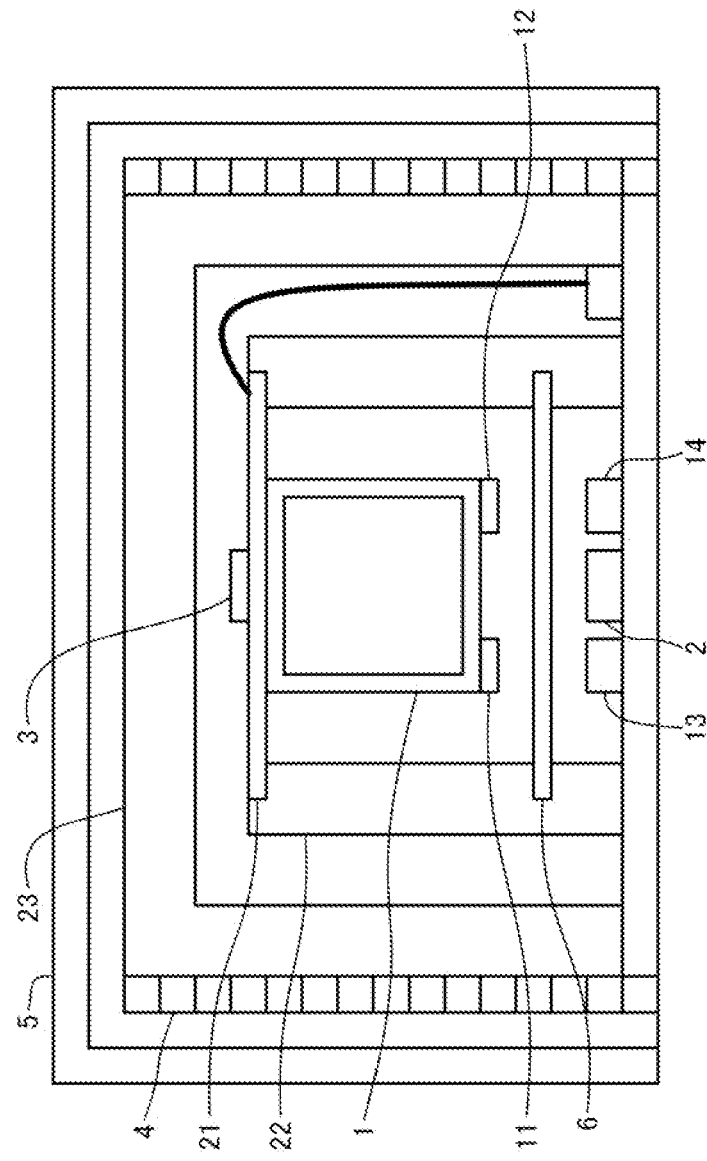
FIG. 4 is a block diagram showing a configuration of an atomic oscillator in a second example embodiment of the present invention.
Figure 5:
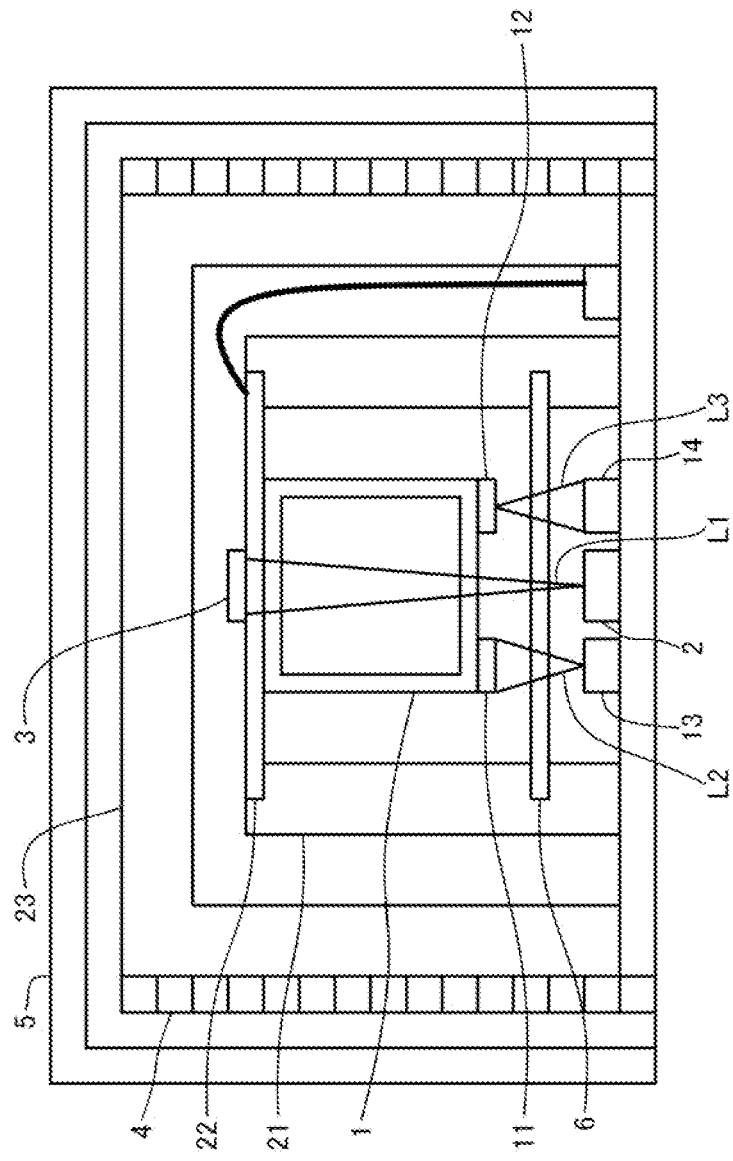
FIG. 5 is a figure showing how the atomic oscillator disclosed in FIG. 4 works.
Figure 6:
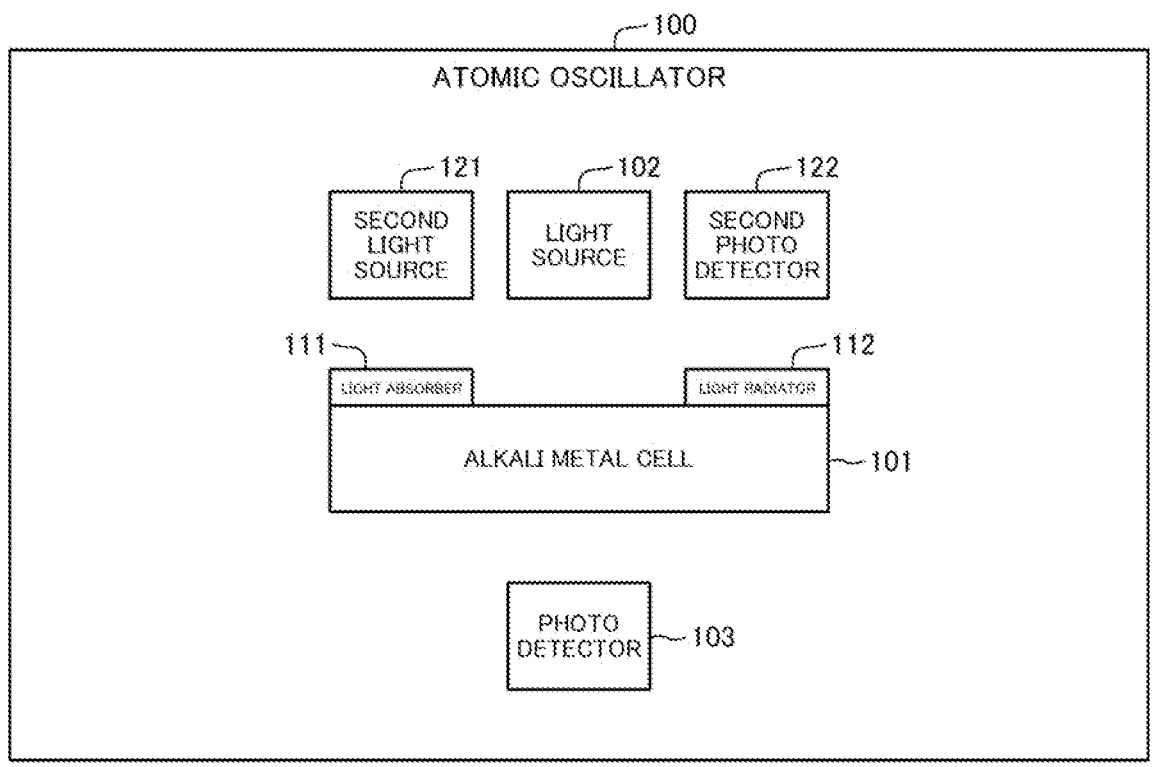
FIG. 6 is a block diagram showing a configuration of an atomic oscillator in a third example embodiment of the present invention.

Next, a second example embodiment of the present invention will be described with reference to FIGS. 4 to 5. FIGS. 5 to 6 are figures for describing a configuration of an atomic oscillator.

In this example embodiment, an example of a specific configuration of the atomic oscillator described in the first example embodiment above. As shown in FIG. 5, the atomic oscillator includes the alkali metal cell 1, a surface emitting laser serving as the light source 2 irradiating the alkali metal cell 1 with excitation light, and the photodetector 3 detecting light having passed through the alkali metal cell 1. In addition to the above, the atomic oscillator includes the light absorber 11 and the light radiator 12 that are formed of black body paint applied to the outer surface of the alkali metal cell 1. Along with this, the atomic oscillator includes an infrared laser as the second light source 13 irradiating the light absorber 11 with light, and a bolometer or pyrometer as the second photodetector 14 detecting the light radiated by the light radiator 12. The atomic oscillator also includes waveplate 6 that changes the polarization state of light, a flexible substrate 21 on which the photodetector 3 is mounted, and a silicon frame 22 that supports the above. The atomic oscillator is configured by covering the above components with a ceramic cover 23, the coil 4 and the magnetic shield 5.

In the atomic oscillator with the above configuration, as indicated by reference symbol L1 in FIG. 5, light L1 is emitted to the alkali metal cell 1 from the light source 2, the light having transmitted through the alkali metal cell 1 is detected by the photodetector 3, and the oscillation frequency is controlled by a light absorption characteristic due to a quantum interference effect caused by two types of resonance light.

In addition to this, in the atomic oscillator, light L2 is emitted from the second light source 13 as indicated by reference symbol L2 in FIG. 5. Consequently, the light absorber 11 absorbs the light L2 emitted by the second light source 13 and raises its temperature, and the alkali metal cell 1 in close contact is heated. The atomic oscillator also detects light L3 radiated from the light radiator 12 as indicated by reference symbol L3 in FIG. 5. Consequently, the control unit 8 detects the temperature of the alkali metal cell 1 from the light detected by the second photodetector 14 from the light radiator 12. Furthermore, the atomic oscillator controls the light emitted from the second light source 13 in accordance with the detected temperature of the alkali metal cell 1. Consequently, the temperature of the alkali metal cell 1 is controlled to be kept within a desired temperature range.

As described above, with the configuration as in this example embodiment, it is also possible to easily manufacture an atomic oscillator that can increase the frequency accuracy at low cost as in the first example embodiment.

Third Example Embodiment

Figure 7:
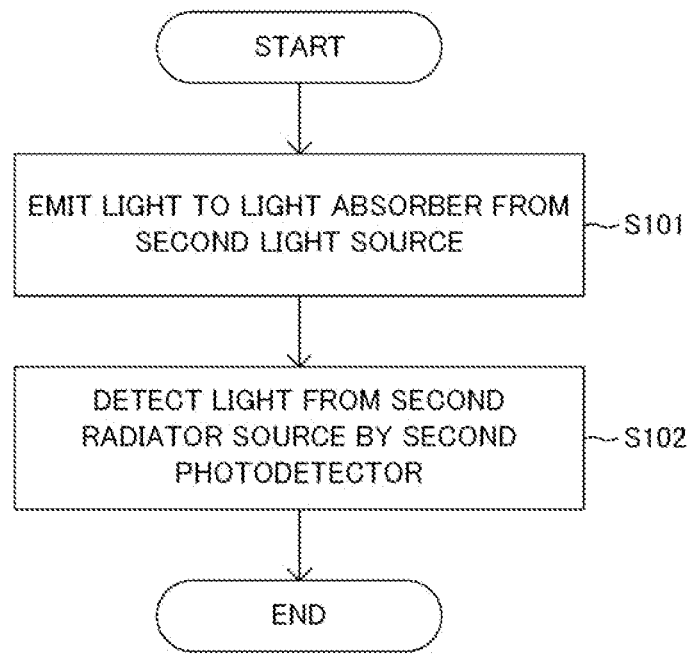
FIG. 7 is a flowchart showing a control operation of the atomic oscillator in the third example embodiment of the present invention.

Next, a third example embodiment of the present invention will be described with reference to FIGS. 6 to 7. FIG. 6 is a block diagram showing a configuration of an atomic oscillator in a third example embodiment, and FIG. 7 is a flowchart showing an operation of the atomic oscillator. In this example embodiment, the overview of configurations of the atomic oscillator and the control method described in the example embodiments is shown.

As shown in FIG. 6, an atomic oscillator 100 in this example embodiment includes an alkali metal cell 101, a light source 102 that irradiates the alkali metal cell with excitation light, and a photodetector 103 that detects transmission light having transmitted by the alkali metal cell. In addition to the above, the atomic oscillator 100 is provided with a light absorber 111 that, in contact with the alkali metal cell, raises its temperature in accordance with absorption light and heats the alkali metal cell, and a light radiator 112 that radiates light in accordance with heat of the alkali metal cell in contact therewith, and includes a second light source 121 that irradiates the light absorber with light and a photodetector 122 that detects light radiated by the light radiator.

Then, in the atomic oscillator 100, as shown in FIG. 7, the second light source 121, which is different from the light source, emits light to the light absorber 111 that is placed in contact with the alkali metal cell 101 to raise its temperature in accordance with absorption light and heat the alkali metal cell (step S101), and the second photodetector 122, which is different from the photodetector, detects light radiated by the light radiator 112 that is placed in contact with the alkali metal cell 101 to radiate light in accordance with heat of the alkali metal cell in contact therewith (step S102).

According to the present invention with the above configuration, with a simple configuration including the light absorber 111 and the light radiator 122 that are placed on the alkali metal cell 101 and the second light source 121 and the second photodetector 122, it is possible to appropriately keep the temperature of the alkali metal cell. As a result, it is possible to easily manufacture an atomic oscillator that can increase the frequency accuracy at low cost.

Although the present invention has been described above with reference to the example embodiments, the present invention is not limited to the above example embodiments. The configurations and details of the present invention can be changed in various manners that can be understood by one skilled in the art within the scope of the present invention.

<Supplementary Notes>

The whole or part of the example embodiments disclosed above can be described as the following supplementary notes. Below, the overview of an atomic oscillator, a control method, a control apparatus, and a program according to the present invention will be described. However, the present invention is not limited to the following configurations.

(Supplementary Note 1)

An atomic oscillator comprising: an alkali metal cell; a light source configured to emit excitation light to the alkali metal cell; and a photodetector configured to detect transmission light passed through the alkali metal cell, wherein a light absorber and a light radiator are placed,
the light absorber being configured to raise a temperature thereof in accordance with absorption light to heat the alkali metal cell in contact with the alkali metal cell,
the light radiator being configured to radiate light corresponding to heat of the alkali metal cell in contact therewith, the atomic oscillator further comprising: a second light source configured to emit light to the light absorber; and a second photodetector configured to detect the light radiated by the light radiator.

(Supplementary Note 2)

The atomic oscillator according to Supplementary Note 1, wherein
the light absorber and the light radiator are each formed of a film member attached to a face of the alkali metal cell.

(Supplementary Note 3)

The atomic oscillator according to Supplementary Note 1 or 2, wherein
the light absorber and the light radiator are each formed of black body paint applied to a face of the alkali metal cell.

(Supplementary Note 4)

The atomic oscillator according to any of Supplementary Notes 1 to 3, wherein
the light absorber is formed of a member having a higher absorptivity to the light emitted by the second light source than to the light emitted by the light source.

(Supplementary Note 5)

The atomic oscillator according to any of Supplementary Notes 1 to 4, wherein
the light absorber is formed to be larger in size than the light radiator.

(Supplementary Note 6)

The atomic oscillator according to any of Supplementary Notes 1 to 5, wherein
the second light source is configured to emit light having a shorter wavelength than light that can be detected by the second photodetector.

(Supplementary Note 7)

The atomic oscillator according to any of Supplementary Notes 1 to 6, comprising
- a control unit configured to detect a temperature of the alkali metal cell based on the light detected from the second photodetector, and control the light emitted by the second light source based on the detected temperature.

(Supplementary Note 8)

A method for controlling an atomic oscillator, the atomic oscillator including: an alkali metal cell; a light source configured to emit excitation light to the alkali metal cell; and a photodetector configured to detect transmission light passed through the alkali metal cell,
- the method comprising:
  - emitting light to a light absorber placed in contact with the alkali metal cell and configured to raise a temperature thereof in accordance with absorption light to heat the alkali metal cell, from a second light source that is different from the light source; and
  - detecting light radiated from a light radiator placed in contact with the alkali metal cell and configured to radiate light corresponding to heat of the alkali metal cell in contact therewith, by a second photodetector that is different from the photodetector.

(Supplementary Note 9)

The method for controlling the atomic oscillator according to Supplementary Note 8, comprising
- detecting a temperature of the alkali metal cell based on the light detected from the second photodetector, and controlling the light emitted from the second light source based on the detected temperature.

(Supplementary Note 10)

A control apparatus controlling an operation of an atomic oscillator, the atomic oscillator including: an alkali metal cell; a light source configured to emit excitation light to the alkali metal cell; and a photodetector configured to detect transmission light passed through the alkali metal cell, the control apparatus being configured to:
- emit light to a light absorber placed in contact with the alkali metal cell and configured to raise a temperature thereof in accordance with absorption light to heat the alkali metal cell, from a second light source that is different from the light source; and
- detect light radiated from a light radiator placed in contact with the alkali metal cell and configured to radiate light corresponding to heat of the alkali metal cell in contact therewith, by a second photodetector that is different from the photodetector.

(Supplementary Note 10.1)

The control apparatus according to Supplementary Note 10, being configured to
- detect a temperature of the alkali metal cell based on the light detected from the second photodetector, and control the light emitted from the second light source based on the detected temperature.

(Supplementary Note 11)

A computer program comprising instructions for causing a control apparatus, which controls an operation of an atomic oscillator including an alkali metal cell, a light source configured to emit excitation light to the alkali metal cell, and a photodetector configured to detect transmission light passed through the alkali metal cell, to execute processes to:
- emit light to a light absorber placed in contact with the alkali metal cell and configured to raise a temperature thereof in accordance with absorption light to heat the alkali metal cell, from a second light source that is different from the light source; and
- detect light radiated from a light radiator placed in contact with the alkali metal cell and configured to radiate light corresponding to heat of the alkali metal cell in contact therewith, by a second photodetector that is different from the photodetector.

DESCRIPTION OF NUMERALS 1 alkali metal cell
2 light source
3 photodetector
4 coil
5 magnetic shield
6 waveplate
7 modulator
8 control unit
11 light absorber
12 light radiator
13 second light source
14 second photodetector
100 atomic oscillator
101 alkali metal cell
102 light source
103 photodetector
111 light absorber
112 light radiator
121 second light source
122 second photodetector

The invention claimed is:

1. An atomic oscillator comprising: an alkali metal cell; a light source configured to emit excitation light to the alkali metal cell; and a photodetector configured to detect transmission light passed through the alkali metal cell,
   wherein a light absorber and a light radiator are placed, the light absorber being configured to raise a temperature thereof in accordance with absorption light to heat the alkali metal cell in contact with the alkali metal cell, the light radiator being configured to radiate light corresponding to heat of the alkali metal cell in contact therewith,
   the atomic oscillator further comprising: a second light source configured to emit light to the light absorber; and a second photodetector configured to detect the light radiated by the light radiator.

2. The atomic oscillator according to claim 1, wherein the light absorber and the light radiator are each formed of a film member attached to a face of the alkali metal cell.

3. The atomic oscillator according to claim 1, wherein the light absorber and the light radiator are each formed of black body paint applied to a face of the alkali metal cell.

4. The atomic oscillator according to claim 1, wherein the light absorber is formed of a member having a higher absorptivity to the light emitted by the second light source than to the light emitted by the light source.

5. The atomic oscillator according to claim 1, wherein the light absorber is formed to be larger in size than the light radiator.

6. The atomic oscillator according to claim 1, wherein the second light source is configured to emit light having a shorter wavelength than light that can be detected by the second photodetector.

7. The atomic oscillator according to claim 1, comprising
a control unit configured to detect a temperature of the alkali metal cell based on the light detected from the second photodetector, and control the light emitted by the second light source based on the detected temperature.

8. A method for controlling an atomic oscillator, the atomic oscillator including: an alkali metal cell; a light source configured to emit excitation light to the alkali metal cell; and a photodetector configured to detect transmission light passed through the alkali metal cell, the method comprising:
emitting light to a light absorber placed in contact with the alkali metal cell and configured to raise a temperature thereof in accordance with absorption light to heat the alkali metal cell, from a second light source that is different from the light source; and detecting light radiated from a light radiator placed in contact with the alkali metal cell and configured to radiate light corresponding to heat of the alkali metal cell in contact therewith, by a second photodetector that is different from the photodetector.

9. The method for controlling the atomic oscillator according to claim 8, comprising
detecting a temperature of the alkali metal cell based on the light detected from the second photodetector, and controlling the light emitted from the second light source based on the detected temperature.

10. A control apparatus controlling an operation of an atomic oscillator, the atomic oscillator including: an alkali metal cell; a light source configured to emit excitation light to the alkali metal cell; and a photodetector configured to detect transmission light passed through the alkali metal cell, the control apparatus being configured to:

emit light to a light absorber placed in contact with the alkali metal cell and configured to raise a temperature thereof in accordance with absorption light to heat the alkali metal cell, from a second light source that is different from the light source; and detect light radiated from a light radiator placed in contact with the alkali metal cell and configured to radiate light corresponding to heat of the alkali metal cell in contact therewith, by a second photodetector that is different from the photodetector.

* * * * *